(12) United States Patent
Woodward

(10) Patent No.: US 6,249,373 B1
(45) Date of Patent: Jun. 19, 2001

(54) SEMICONDUCTOR OPTICAL AMPLIFIER WITH ADJUSTABLE GAIN

(75) Inventor: Sheryl Leigh Woodward, Holmdel, NJ (US)

(73) Assignee: AT&T Corp., New York, NY (US)

(*) Notice: Subject to any disclaimer, the term of this patent is extended or adjusted under 35 U.S.C. 154(b) by 0 days.

(21) Appl. No.: 09/470,419

(22) Filed: Dec. 22, 1999

(51) Int. Cl.[7] ....................................... H01S 3/00
(52) U.S. Cl. ............................ 359/344; 359/346; 372/43
(58) Field of Search ................................. 359/344, 346; 257/18; 372/43

(56) References Cited

U.S. PATENT DOCUMENTS 5,991,068 * 11/1999 Massicott et al. .................. 359/337
6,020,991 * 2/2000 Yoshinori et al. .................. 359/341

FOREIGN PATENT DOCUMENTS 8-184864 * 7/1996 (JP).

* cited by examiner

Primary Examiner—Mark Hellner

(57) ABSTRACT

A semiconductor optical amplifier includes an optical signal input and an active section surrounded by two mirrors. A current is applied to the second mirror, for example by a current generator. Thus, the central wavelength of the reflection range of the second mirror is modifiable, the loss of the semiconductor-optical amplifier is changeable and the gain of the amplifier is adjustable.

23 Claims, 4 Drawing Sheets

SEMICONDUCTOR OPTICAL AMPLIFIER WITH ADJUSTABLE GAIN

BACKGROUND OF THE INVENTION

1. Field of Invention

This invention relates to optical signal processing. More particularly, this invention relates to amplification of optical signals using a semi-conductor component.

2. Description of Related Art

Optical amplifiers amplify optical signals prior to, or during, transmission of the signal over an optical network.

In optical networks, many fiber links are loss limited. One cause is the limited power available from typical laser diodes. Optical fiber non-linearities may also limit the transmission power of optical signals. This limited power, combined with the losses in the fiber and other system components, restricts the length of fiber that can be used without optical amplification.

Optical amplifiers increase the power level of an optical signal beam without conversion to the electrical domain. For example, gains of 30 dB are attainable at 1550 nm using semiconductor-optical amplifiers (SOAs).

As shown in FIG. 1, there are a number of possible locations for optical amplifiers 100 in an optical network. An optical amplifier 100 just following a transmitter increases the power traveling down the fiber. Optical amplifiers 100 along the fiber path continually keep the power levels above system noise. An optical amplifier 100 located at the fiber end acts as a receiver pre-amplifier, enhancing its sensitivity. Many optical amplifiers can be placed in a fiber network to extend the total path length to thousands of kilometers.

One particular type of optical amplifier commonly used by the telecommunication industry is an Erbium Doped Fiber Amplifier (EDFA). However, EDFAs are complex, expensive to produce and amplify over a limited range of wavelengths.

Amplification in an EDFA is provided by optically pumping erbium atoms within the fiber of the EDFA. These atoms provide gain over a limited bandwidth around a wavelength $\lambda$ approximately equal to 1550 nm. This is determined by the physical properties of the Erbium atoms.

In contrast, the gain of a SOA is determined by the semiconductor material. The central wavelength of the gain band is determined by the composition and structure of the semiconductor material. Thus, a SOA can be manufactured to provide gain at wavelengths not served by EDFAs. In addition, a SOA is not optically pumped. Gain is provided by applying a current to the device. Thus, a SOA is simpler, and more compact than an EDFA.

A variation of the typical SOA is a gain-clamped SOA (GC-SOA). It is advantageous to clamp the gain of a SOA because, when the gain is not clamped, it varies as a function of the total input signal power. When the input signal is made of multiple wavelength channels, this leads to cross-talk between wavelength channels.

The gain of a SOA increases with the number of carriers in the active section which are in an excited state. In a GC-SOA the carrier density is clamped by the lasing action at another wavelength. The gain at the lasing wavelength will equal the loss of the lasing cavity. This gain is approximately the same gain seen by the incoming signals. There is some wavelength dependence of gain, and the signals are at other wavelengths. The cavity loss is equal to the internal loss, due to effects such as absorption, plus the mirror loss. The mirror loss is equal to $\ln(1/R_1 * R_2)/2L$, where $\ln$ denotes the natural logarithm, $R_1$ and $R_2$ denote the reflectivity of the mirrors at the lasing wavelength and L denotes the effective length of the cavity. As the current to the Bragg reflectors is varied, the reflectivity v. wavelength curve shifts.

Adjusting the gain by changing the current to the active section relies on the fact that the carrier density is imperfectly clamped. Non-radiative effects, such as Auger recombination, cause the carrier density to increase at higher current levels. These are higher-order effects, and for best device performance are usually minimized.

Wolfson et al. discloses an active GC-SOA (referred to as GC-SOA-A) where the Bragg reflectors are tuned in unison in "Detailed Theoretical Investigation of the Input Power Dynamic Range for Gain-Clamped Semiconductor Optical Amplifier Gates at 10 Gb/s", *IEEE Photonics Technology Letters*, Vol. 10, No 9, September 1998. This technique shifts the peak wavelength of the Bragg reflectors and the lasing wavelength. By shifting the lasing wavelength, the carrier density of the cavity must shift to preserve the lasing condition. The tuning currents also introduce a small amount of additional loss in the cavity. Therefore, tuning the lasing by tuning the reflective mirrors together results in a small change in the gain of the GC-SOA-A. A drawback to this gain control mechanism is that the lasing wavelength must vary by a significant amount to change the gain at the signal wavelengths. Therefore, the system may need to reserve a wide wavelength band for the lasing wavelength, and that band will not be available for use by the signal wavelengths.

Conventionally, the gain of GC-SOAs was typically adjusted by adjusting the current applied to the active section, or by adjusting the current to both mirror sections, so that they remained aligned. However, these methods alter the gain due to second or third order effects. Therefore, adjustment in this way is somewhat limited.

The effective gain of a GC-SOA can be adjusted using a variable attenuator in combination with the GC-SOA and adjusting the attenuation provided by the attenuator. By increasing the attenuation, output signal power is decreased. However, using a variable attenuator in conjunction with a GC-SOA is often detrimental to optical signal quality because the attenuator simply reduces the output power level. Moreover, adjusting the gain of a GC-SOA by adjusting the current applied to the active section of a GC-SOA affects the gain only through second or third order effects. Therefore, the user can only adjust the clamped gain by small amounts.

SUMMARY OF THE INVENTION

Thus, there is a need for a GC-SOA having an electrically adjustable and controllable gain that is simple in design and relatively inexpensive to produce.

This and other features and advantages of this invention are described in or are apparent from the following detailed description of the system and methods according to this invention.

BRIEF DESCRIPTION OF THE DRAWINGS

The benefits of the present invention will be readily appreciated and understood from consideration of the following detailed description of the exemplary embodiments of this invention, when taken with the accompanying drawings, in which.

DETAILED DESCRIPTION OF PREFERRED EMBODIMENTS

Figure 1:
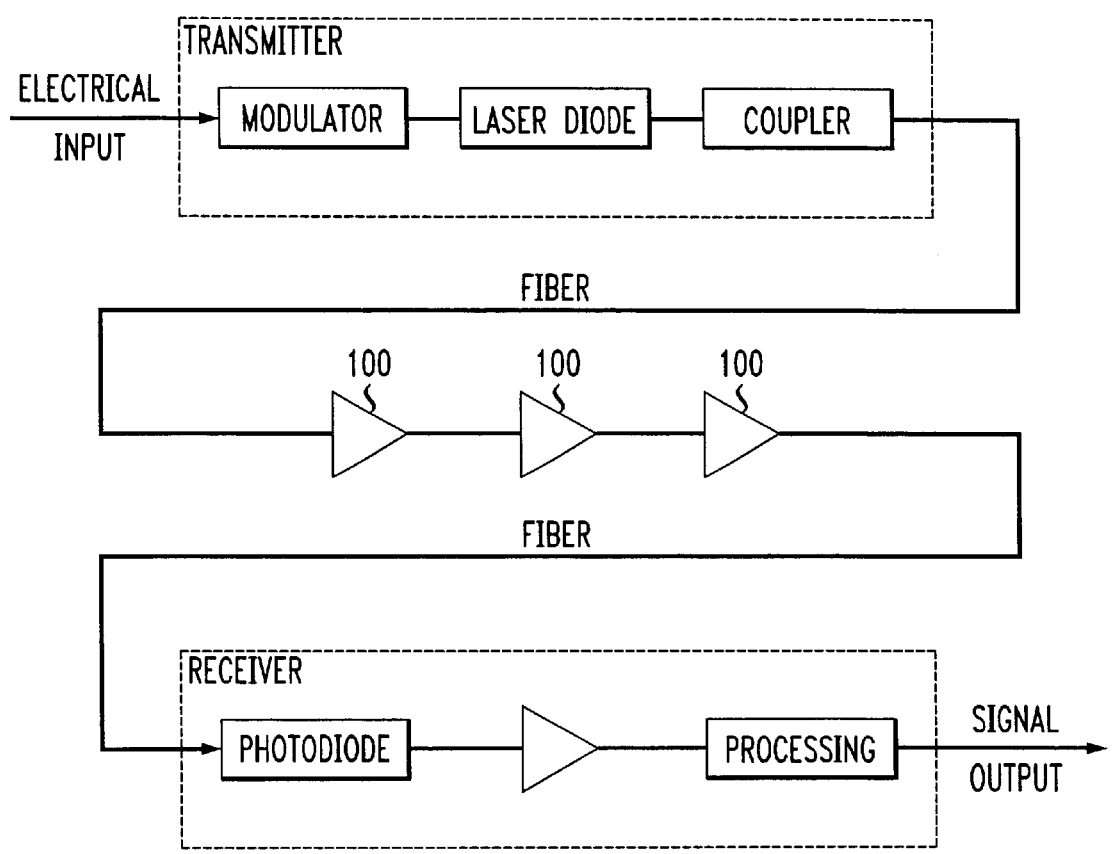
FIG. 1 is a diagram of a conventional long-distance fiber communication system.
Figure 2:
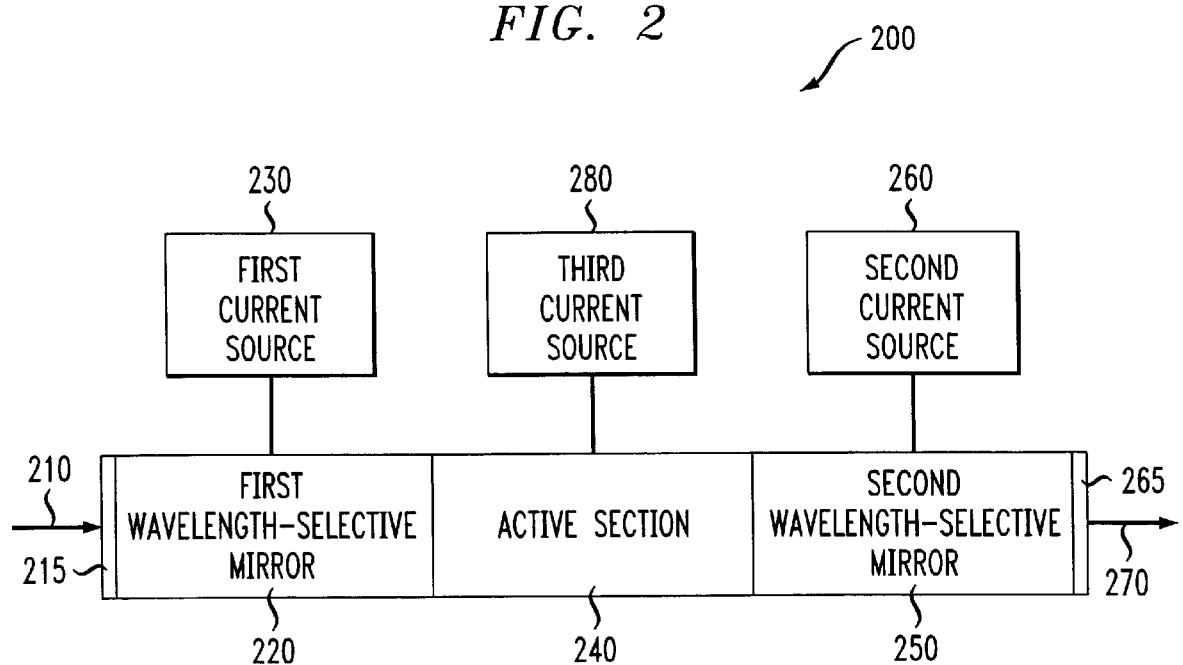
FIG. 2 schematic diagram of a SOA according to a first exemplary embodiment of the invention.

FIG. 2 is a schematic diagram of a GC-SOA according to a first exemplary embodiment of the invention. As shown in FIG. 2, the SOA 200 includes a signal input 210, a first anti-reflection coating 215, a first wavelength-selective mirror 220, a first current source 230, an active section 240, a second wavelength-selective mirror 250, a second current source 260, a second anti-reflection coating 265, a signal output 270 and a third current source 280.

The signal input 210 receives an optical signal from an optical signal generator, as, for example, a modulated laser diode. The signal output 270 transmits the amplified signal output by the SOA to a signal destination as, for example, another component in an optical network. The signal input 210 provides an input optical signal to the active section 240. The first wavelength-selective mirror 220 cooperates with the second wavelength-selective mirror 250 to allow the active section 240 to lase at a predetermined wavelength $\lambda_L$. At the laser wavelength $\lambda_L$, the lasing action clamps the gain of the SOA 200 so that it is approximately equal to the power loss of the cavity formed between the wavelength-selective mirrors 220 and 250 at the lasing wavelength $\lambda_L$.

In the first exemplary embodiment of the invention, a waveguide runs the length of the SOA 200. The first wavelength-selective mirror 220 includes a Bragg grating. The active section 240 contains a semiconductor material designed to provide gain at the signal and lasing wavelengths. Current source 280 is used to promote carriers within the semiconductor material into the excited state(the gain of a semiconductor is a function of the density of excited carriers). In the first exemplary embodiment of the invention, the second wavelength-selective mirror 250 also includes a Bragg grating.

The first wavelength-selective mirror 220 has a wavelength at which the reflectivity of the first wavelength-selective mirror 220 is maximum. The wavelength at which the reflectivity of the second wavelength-selective mirror 250 is maximum is tunable to be different than the wavelength at which the reflectivity of the first wavelength-selective mirror 220 is maximum.

As shown in FIG. 2, the first current source 230 provides a first current $I_1$ to the first wavelength-selective mirror 220. The second current source 260 provides a second current $I_2$ to the second wavelength-selective mirror 250. It should be appreciated that the active section 240 is electrically isolated from both the first mirror 220 and the second mirror 250, electrical isolators being provided at each end of the active section 240 during the manufacturing process.

Controlling the current injected to the SOA via either $I_1$ or $I_2$ provides the capability of controlling the central reflected wavelength $\lambda_{cr}$ in the reflection band of the first wavelength-selective mirror 220 or the second wavelength-selective mirror 250, respectively. In the first exemplary embodiment, wavelength-selective mirrors 220 and 250 have the same central reflected wavelength $\lambda_{cr}$ when the same current is applied to them. However, when currents $I_1$ and $I_2$ are different, the central wavelengths $\lambda_{cr}$ of the mirrors differ.

Figure 3:
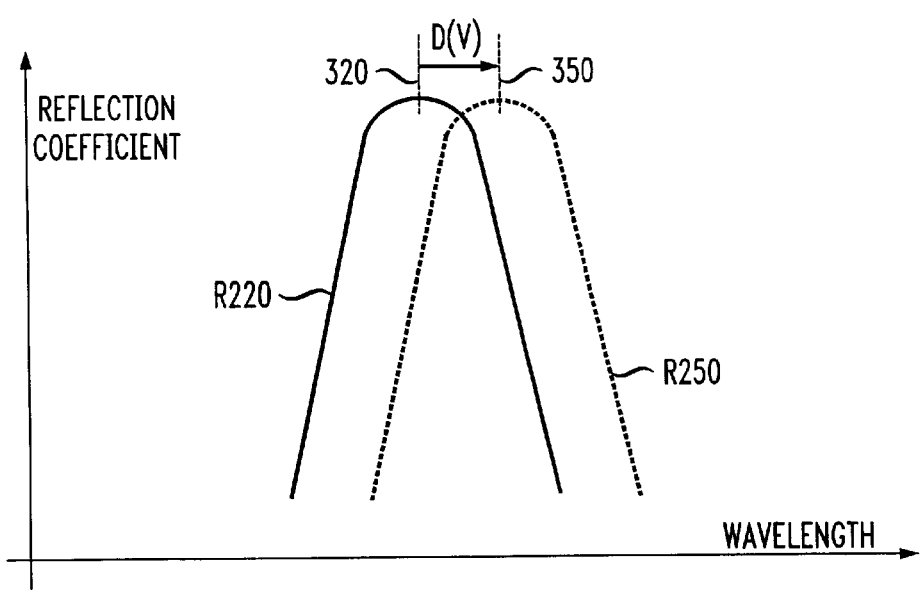
FIG. 3 shows reflection responses of two Bragg gratings used in conjunction with an SOA according to the exemplary embodiment of the invention.

FIG. 3 shows reflection response curves of two Bragg gratings used in first and second wavelength-selective mirrors 220 and 250 respectively. The reflection response curve of a grating represents the relation between the reflection coefficient and the wavelength. In FIG. 3, the reflection response curves are shown as a graph where wavelengths are represented along the horizontal axis and response coefficients are represented along the vertical axis. FIG. 3 shows, by a plain black line, a portion of the reflection response R220 of the wavelength-selective mirror 220, near a maximum 320 of the reflection response. FIG. 3 also shows, by a dashed line, a portion of the response R250 of the wavelength-selective mirror 250, near a maximum 350 of the reflection response.

The two response curves R220 and R250 are identical but the response R250 is shifted to the right of response R220 by an offset D(I). Offset D(I) is a function of the difference between the currents $I_1$ and $I_2$. Therefore, either $I_1$ or $I_2$ can be set to zero, which minimizes loss in the optical cavity, and the other current $I_1$ or $I_2$ is set to a non-zero level. Additionally, either of the currents $I_1$ and $I_2$ may be adjusted to provide an adjustable gain SOA. As the offset D(I) increases, the losses affecting optical power at the lasing wavelength $\lambda_L$ also increase As a result, the gain of the SOA also increases proportionally. Thus, by applying a differential current to the wavelength-selective mirrors 220, 250, the gain of the SOA is altered. By controlling the current difference between $I_1$ and $I_2$, the gain of the SOA is controlled. However, the offset D(I) and the third current source 280 is provided such that the active section 240 always lases.

The lasing wavelength $\lambda$ shifts to approximately where the mirror loss within the cavity is at a minimum, i.e., to a wavelength $\lambda$ such that $R_1(\lambda)*R_2(\lambda)$ is maximum, where $R_1(\lambda)$ and $R_2(\lambda)$ are the reflectivity of the wavelength selective mirrors 220 and 250, respectively. However, the lasing wavelength will not be precisely where $R_1(\lambda)*R_2(\lambda)$ is maximum because the round trip phase shift must be a multiple of $2\pi$. Because the central reflected wavelength of the two Bragg reflectors differ, the mirror loss of the lasing cavity at the new lasing wavelength will be greater than it was when the two Bragg reflectors had the same central reflected wavelengths. However, as mirror loss increases, the carrier density in the active section 240 will also increase, so that, at the lasing wavelength, the gain of the lasing wavelength equals the loss of the cavity. This increase in carrier density will also increase the gain of the SOA at other wavelengths because the gain varies approximately linearly with carrier density. Thus, by controlling the difference between the currents $I_1$ and $I_2$, the loss of the cavity at the lasing wavelength ($\lambda_L$) is controlled and the gain of the semiconductor-optical amplifier is adjustable.

Increasing the tuning current to the Bragg grating also increases the loss of the Bragg grating. As the signal beam is transmitted through the Bragg grating, it will, therefore, experience more loss when the tuning current is high. It is usually preferable to place this loss after the active section 240, so that the signal has already been amplified. Therefore, it is preferable to tune the second Bragg grating.

It should be appreciated that the gain is adjusted through a first order effect and not, as in other gain-clamped SOAs, through a second or third order effect. Unlike a GC-SOA-A, the lasing wavelength need not vary by much to achieve a change in the gain of the amplifier. Therefore, a smaller wavelength band needs to be reserved for the lasing wavelength.

Figure 4:
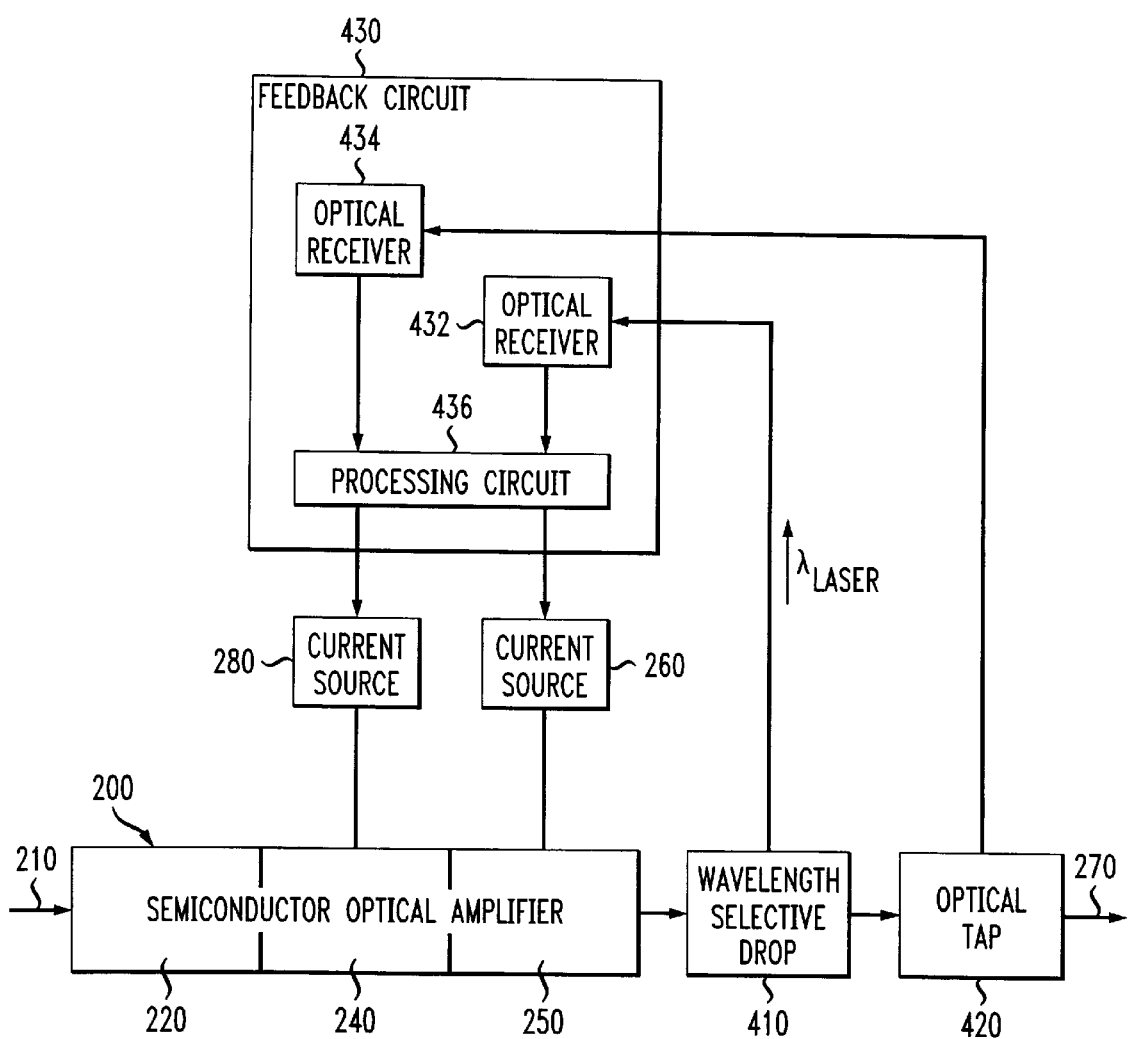
FIG. 4 is a schematic diagram of an optical system according to a second exemplary embodiment of this invention.

FIG. 4 is a schematic diagram of an optical system according to a second exemplary embodiment of this invention. As shown in FIG. 4, a wavelength selective drop 410 is located downstream of the SOA 200. The wavelength selective drop 410 drops the light having the wavelength at which the SOA 200 lases and conveys the dropped light to a feedback circuit 430. An optical tap 420 is located downstream of the wavelength selective drop 410 and drops a portion of the energy of the signal having the wavelength input in the SOA 200. The optical tap 420 conveys this portion to the feedback circuit 430.

The feedback circuit 430 comprises a first optical receiver 432 that converts the optical energy received from the wavelength selective drop 410 into an electrical signal. The feedback circuit 430 also comprises a second optical receiver 434 that converts the optical energy received from the optical tap 420 into an electrical signal.

The feedback circuit 430 further comprises a processing circuit 436 that processes the electrical signals from the first and second optical receivers and provides control signal for controlling the second current source 260 and for controlling the third current source 280. The processing circuit 436 adjusts the control signals to control the current injected by the second current source 260 in the second wavelength-selective mirror 250 so that the gain of the SOA 200 is maintained at a predetermined value. The processing circuit 436 adjusts the control signals based on at least one of the energy of the portion of the amplified signal that is dropped by the optical tap 420 and the energy of the portion of the optical signal that is dropped by the wavelength selective drop 410. For example, the processing circuit 436 may adjust current source 260 so that the average optical power received at optical receiver 434 is equal to a predetermined value, and it may adjust current source 280 so that the average optical power received at optical receiver 432 is equal to a predetermined value.

Figure 5:
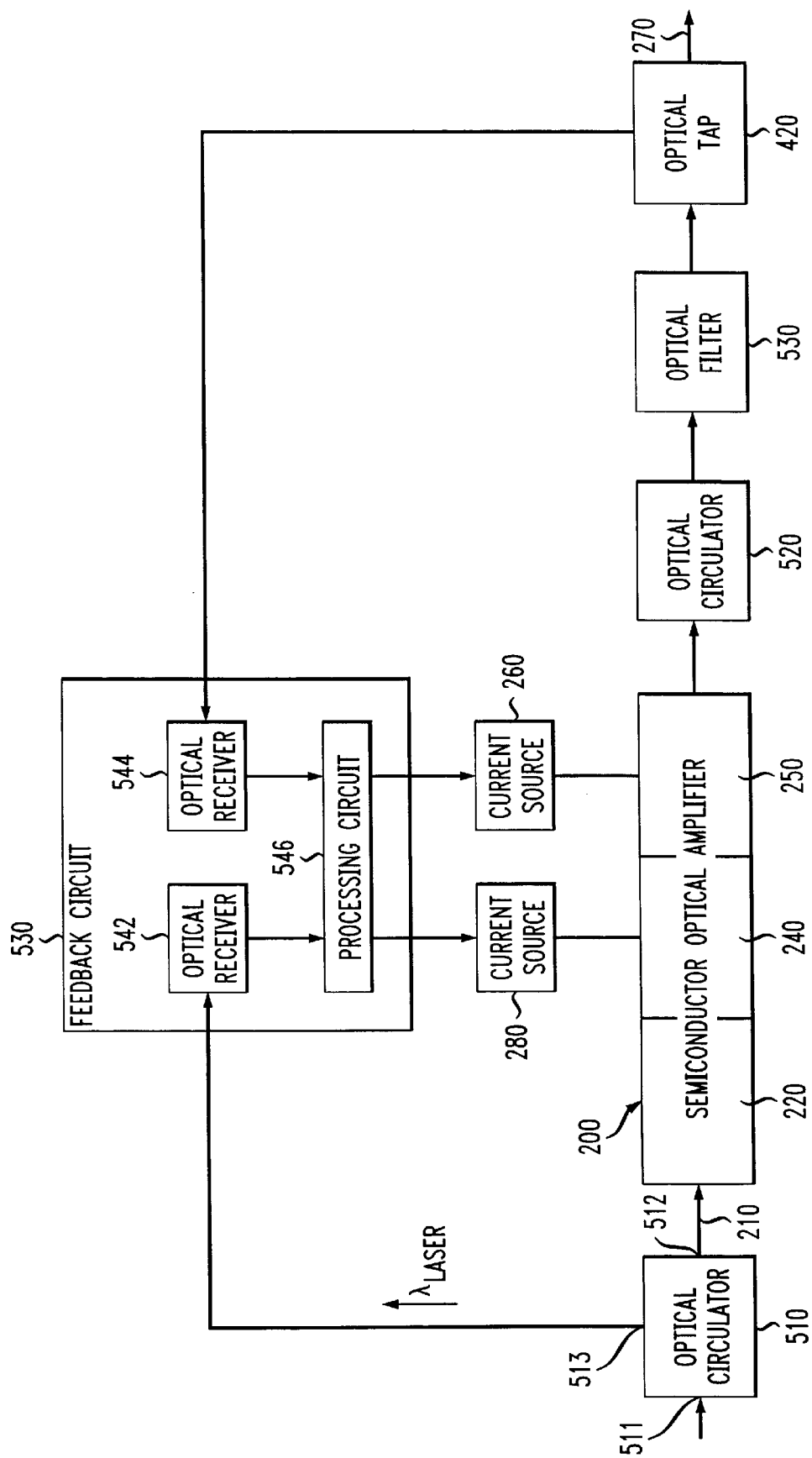
FIG. 5 is a schematic diagram of an optical system according to a third exemplary embodiment of this invention.

FIG. 5 is a schematic diagram of an optical system according to a third exemplary embodiment of this invention. As shown in FIG. 5, an optical circulator 510 is located upstream of the SOA 200. The optical circulator 510 receives the input light at its input port 511 and outputs, at its port 512, the input light toward the SOA 200. Because the SOA 200 emits light having the wavelength at which the SOA 200 lases from both ends, the optical circulator 510 receives light at the wavelength at which the SOA 200 lases from the SOA 200, at its port 512. This light is dropped by the optical circulator 510 and conveyed, through its port 513 to a feedback circuit 540.

An optical circulator 520 is located downstream of the SOA 200 and an optical filter 530 is located downstream of the optical isolator 520. The optical filter 530 removes light having the wavelength at which the SOA 200 lases. An optical tap 420 is located downstream of the optical filter 530 and drops a portion of the energy of the signal having the wavelength input in the SOA 200. The optical tap 420 conveys this portion to the feedback circuit 540.

The feedback circuit 540 comprises a first optical receiver 542 that converts the optical energy received from the optical circulator 510 into an electrical signal. The feedback circuit 540 also comprises a second optical receiver 544 that converts the optical energy received from the optical tap 420 into an electrical signal.

The feedback circuit 540 further comprises a processing circuit 546 that processes the electrical signals from the first and second optical receivers and provides control signal for controlling the second current source 260 and for controlling the third current source 280. The processing circuit 546 adjusts the control signals to control the current injected by the second current source 260 in the second wavelength-selective mirror 250 so that the gain of the SOA 200 is maintained at a predetermined value. The processing circuit 546 adjusts the control signals based on at least one of the energy of the portion of the amplified signal that is dropped by the optical circulator 510 and the energy of the portion of the optical signal that is dropped by the optical tap 420.

While this invention has been described in conjunction with the exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A method for amplifying an optical signal, comprising:
   inputting the optical signal to be amplified at one of a first and a second wavelength-selective mirrors, the first mirror having a wavelength at which the reflectivity is maximum, the first wavelength-selective mirror being coupled to the second wavelength-selective mirror and to an active section located between the first and second wavelength-selective mirrors; and
   setting a wavelength at which a reflectivity of the second wavelength-selective mirror is maximum to a wavelength different from the wavelength at which the reflectivity of the first wavelength-selective mirror is maximum, wherein the wavelength of the input signal is different than the wavelengths at which the reflectivity of the first and second wavelength-selective mirrors is maximum.

2. The method of claim 1, further comprising varying the wavelength at which the reflectivity of the second wavelength-selective mirror is maximum.

3. The method of claim 2, wherein varying the wavelength at which the reflectivity of the second wavelength-selective mirror is maximum comprises varying a current injected in the second wavelength-selective mirror.

4. The method of claim 3, further comprising controlling the current injected in the second wavelength-selective mirror so that an amplification gain is equal to a predetermined value.

5. The method of claim 4, further comprising dropping a portion of an optical signal output through the second wavelength-selective mirror and controlling the current injected in the second wavelength-selective mirror based on an energy of the portion of the optical signal that is dropped.

6. A semiconductor optical amplifier comprising:
   a first wavelength-selective mirror;
   a second wavelength-selective mirror;
   an active section located between the first and second wavelength-selective mirrors;
   wherein a wavelength at which a reflectivity of the second wavelength-selective mirror is maximum is tunable to be different from a wavelength at which a reflectivity of the first wavelength-selective mirror is maximum.

7. The semi-conductor optical amplifier of claim 6, further comprising a variable wavelength controller coupled to the second wavelength-selective mirror that controls variation of the wavelength at which the reflectivity of the second wavelength-selective mirror is maximum.

8. The semiconductor optical amplifier of claim 6, wherein the first wavelength-selective mirror is a Bragg grating.

9. The semiconductor optical amplifier of claim 6, wherein the second wavelength-selective mirror is a Bragg grating.

10. The semiconductor optical amplifier of claim 7, wherein the variable wavelength controller controls variation of a current injected in the second wavelength-selective mirror.

11. The semiconductor optical amplifier of claim 6, further including a first current source that provides a first current to the first wavelength-selective mirror, wherein the first current source is adjustable to provide the first current as an adjustable current.

12. The semiconductor optical amplifier of claim 6, further comprising a second current source that provides a second current to the second wavelength-selective mirror, wherein the second current source is adjustable to provide the second current as an adjustable current.

13. The semiconductor optical amplifier of claim 7, further comprising a controller circuit that controls and is coupled to the variable wavelength controller.

14. The semiconductor optical amplifier of claim 13, wherein the controller circuit adjusts the variable wavelength controller so that a gain of the semiconductor optical amplifier is equal to a predetermined value.

15. The semiconductor optical amplifier of claim 13, wherein the controller circuit adjusts the variable wavelength controller so that an optical power of the output signal is equal to a predetermined value.

16. The semiconductor optical amplifier of claim 13, wherein the variable wavelength controller comprises a second current source that provides a second current to the second wavelength-selective mirror and wherein the controller circuit controls the current injected by the second current source in the second wavelength-selective mirror.

17. The semiconductor optical amplifier of claim 13, further comprising an optical tap that drops a portion of an amplified signal output through the second wavelength-selective mirror, the optical tap being coupled with the controller circuit.

18. The semiconductor optical amplifier of claim 17, wherein the controller circuit controls variable wavelength controller based on an energy of a portion of the amplified signal that is dropped by the optical tap.

19. The semiconductor optical amplifier of claim 13, further comprising an active section controller, coupled to the active section, the active section controller controlling the optical output power of the semiconductor optical amplifier, wherein the controller circuit is also connected to the active section controller of the semiconductor optical amplifier.

20. The semiconductor optical amplifier of claim 19, further comprising a wavelength selective-drop that drops a portion of an optical signal having a wavelength at which the semiconductor optical amplifier lases, the wavelength selective drop being coupled with the controller circuit.

21. The semiconductor optical amplifier of claim 20, wherein the controller circuit controls the active section controller based on an energy of the light that is dropped by the wavelength selective drop.

22. The semiconductor optical amplifier of claim 19, further comprising an optical circulator that drops an optical signal having a wavelength at which the semiconductor optical amplifier lases, the optical circulator being coupled with the controller circuit.

23. The semiconductor optical amplifier of claim 22, wherein the controller circuit controls the active section controller based on an energy of the light that is dropped by the optical circulator.

\* \* \* \* \*